(12) United States Patent
Park et al.

(10) Patent No.: US 6,570,477 B2
(45) Date of Patent: May 27, 2003

(54) LOW INDUCTANCE MULTILAYER CHIP AND METHOD FOR FABRICATING SAME

(75) Inventors: In-Kil Park, Suwon-Si (KR); Duk-Hee Kim, Anyang-Si (KR)

(73) Assignee: Innochips Technology, Kyungki-do (KR)

( * ) Notice: Subject to any disclaimer, the term of this patent is extended or adjusted under 35 U.S.C. 154(b) by 0 days.

(21) Appl. No.: 09/847,782

(22) Filed: May 2, 2001

(65) Prior Publication Data

US 2002/0005541 A1 Jan. 17, 2002

(30) Foreign Application Priority Data

May 9, 2000 (KR) .......................................... 2000-24574
Aug. 30, 2000 (KR) .......................................... 2000-50629

(51) Int. Cl.⁷ .............................................. H01F 5/00
(52) U.S. Cl. ........................... 336/200; 336/83; 336/192
(58) Field of Search ............................. 336/65, 83, 183, 336/192, 200, 206, 6, 208, 223, 232; 257/531

(56) References Cited

U.S. PATENT DOCUMENTS 5,884,990 A * 3/1999 Burghartz et al. .......... 336/200
6,229,425 B1 * 5/2001 Kobayashi .................. 336/200

* cited by examiner

*Primary Examiner*—Tuyen T. Nguyen
(74) *Attorney, Agent, or Firm*—Merchant & Gould P.C.

(57) ABSTRACT

The invention relates to a low inductance multilayer chip and a method for fabricating the same, the multilayer chip including a plurality of internal electrode layers where the internal electrodes of the predetermined layers are electrically connected to reverse the current directions flowing in the internal electrodes of neighboring layers to thereby offset inductance and performing stable operations at high frequency.

10 Claims, 14 Drawing Sheets

LOW INDUCTANCE MULTILAYER CHIP AND METHOD FOR FABRICATING SAME

BACKGROUND OF THE INVENTION

Field of the Invention

The present invention relates to a multilayer chip fabricated with a variety of electronic parts such as capacitor, varistor, Negative Temperature Characteristic (NTC) thermistor, Resistor Capacitor (RC) coupled element and the like, and more particularly to a low inductance multilayer chip having a characteristic of stabile operations at high frequency by offsetting inductance with an improved internal pattern of a multilayer chip.

DESCRIPTION OF THE INVENTION

Recently, high frequency has been utilized for operations of electronic goods like personal portable communication devices, personal computer system, etc., so that there has also been a demand on electronic parts to be embedded in the electronic goods that can operate stably at high frequency.

The exemplary electronic parts as such are passive elements including resistor, capacitor, inductor and so on. The passive elements have generally been produced in a single element configuration, but they have also been produced in a composite element by coupling more than two passive elements to improve packaging efficiency and reduce noise among elements.

However, even if the electronic parts thus constructed have a characteristic of stable operations at a low frequency, they show unstable operations at a high frequency so that they are disadvantageous to be applied to electronic devices using a high operational frequency.

For instance, capacitor shows a stable, unique operational characteristic at a low frequency, but an increase in equivalent inductance component at a high frequency and a concomitant occurrence of parasitic oscillations or a corresponding increase in impedance to drop speed in response.

In other words, a multilayer chip capacitor, as shown in FIG. 1, includes layers having internal electrodes respectively connected to positive and negative external electrodes. As a result, current flows from the positive electrode through dielectric layers to the negative electrode, generating self-inductance to disturb the flow of current and, what's worse, drastically increasing it at a high frequency.

In addition, a RC coupled element, as shown in FIG. 2, is generally made in a repeated arrangement of RC circuits on a chip. If a frequency-impedance characteristic of the RC coupled element as such is measured with a network analyzer, there is an increase in impedance due to an increased equivalent inductance component caused by a capacitor when operational frequency gets over hundreds of MHz and, accordingly, a drop in the response speed of the RC coupled element.

SUMMARY OF THE INVENTION

It is an object of the present invention to solve the aforementioned problems and provide a low inductance multilayer chip having a characteristic of stable operations at high frequency with an improvement in an internal pattern of the multilayer chip to offset inductance by making in reverse the current directions flow through internal electrodes of neighboring layers and a method for fabricating the same.

It is another object of the present invention to provide a low inductance multilayer chip having a characteristic of stable operations at high frequency by employment of resistance in through holes of the chip and formation of capacitor layers in which current can flow in the reverse directions at neighboring layers and a method for fabricating the same.

It is a further anther object of the present invention to provide a low inductance multilayer chip having a characteristic of stable operations at high frequency by formation of capacitor layers in which current can flow in the reverse directions at neighboring layers and stacking of resistor layer and the capacitor layers, and a method for fabricating the same.

It is a still another object of the present invention to provide a multilayer chip that can conveniently adjust resistance value by printing resistive paste onto the surface of green sheets for formation of resistor layers and stacking of capacitor layers and the resistor layers, and a method for fabricating the same.

In order to accomplish the aforementioned objects of the present invention, there is provided a low inductance multilayer chip of the present invention, the chip having a plurality of stacked layers formed internal electrodes thereon wherein the internal electrodes are electrically connected to reverse the current directions flowing in the internal electrodes of neighboring layers.

In addition, in order to accomplish the aforementioned objects of the present invention, there is provided another low inductance multilayer chip, the chip comprising: a stacked structure having a plurality of green sheets with at least more than one through hole; internal electrodes formed on the green sheet; external electrodes formed at both ends of the stacked structure to be electrically connected with a predetermined internal electrode; and conductive material formed in the through holes to reverse the current directions flowing in the internal electrode of the neighboring green sheets by electrically connecting the internal electrodes of the predetermined green sheets.

Besides, in order to accomplish the aforementioned objects of the present invention, there is provided another low inductance multilayer chip, the chip having a plurality of stacked layers formed internal electrodes thereon wherein the internal electrodes are electrically connected by resistive material to reverse the current directions flowing in the internal electrodes of neighboring layers.

Furthermore, in order to accomplish the aforementioned objects of the present invention, there is provided another low inductance multilayer chip, the chip comprising: a stacked structure of a plurality of green sheets with at least more than one through holes; internal electrodes formed in the green sheets; external electrodes formed at both ends of the stacked structure to be electrically connected with a predetermined internal electrode; and conductive material formed in the through holes to reverse the current directions flowing in the internal electrode of the neighboring green sheets by electrically connecting the internal electrodes of the predetermined green sheets.

Also, in order to accomplish the aforementioned objects of the present invention, there is provided another low inductance multilayer chip, the chip comprising resistor layers; and capacitor layers wherein the internal electrodes of the predetermined layers are electrically connected to reverse current directions flowing in the internal electrodes of neighboring layers.

Additionally, in order to accomplish the aforementioned objects of the present invention, there is provided another multilayer chip, the chip comprising: capacitor layers; resistor layers constructed with at least more than one green sheet, the surface of which is printed by resistive material; and external electrodes formed at both ends of the stacked structure constructed with the capacitor layers and resistor layers for electrical connection.

On the other hand, in order to accomplish the aforementioned objects of the present invention, there is provided a method for fabricating a low inductance multilayer chip, the method comprising the steps of: manufacturing green sheets; forming through holes in the green sheets; forming internal electrodes on the surface of the green sheets and in the through holes; stacking the green sheets to reverse the current directions flowing in the internal electrodes of the adjacent green sheets by electrically connecting the internal electrodes formed on the surface of the predetermined green sheets through those formed in the through holes; compressing the stacked green sheets; thermally plasticizing the compressed stacked structure; and forming external electrodes at both ends of the stacked structure for electrical connection with the predetermined internal electrodes.

Also, in order to accomplish the aforementioned objects of the present invention, there is provided another method for fabricating a low inductance multilayer chip, the method comprising the steps of: manufacturing green sheets; forming through holes in the green sheets; forming resistive material in the through holes; forming internal electrodes on the green sheets; stacking the green sheets to reverse the current directions flowing in the internal electrodes of neighboring green sheets by electrically connecting the internal electrodes of the predetermined green sheets through the resistive material of the through holes; compressing the stacked green sheets; thermally plasticizing the compressed stacked structure; and forming external electrodes at both ends of the stacked structure for electrical connection of the predetermined internal electrodes.

In addition, in order to accomplish the aforementioned objects of the present invention, there is provided a method for fabricating a low inductance multilayer chip, the method comprising the steps of: manufacturing resistor layers; manufacturing capacitor layers with internal electrodes being electrically connected to reverse the current directions flowing in the internal electrodes of adjacent layers; stacking and compressing the resistor layers and capacitor layers; thermally plasticizing the compressed stacked structure; and forming external electrodes at both ends of the stacked structure for electrical connection with the resistor layers and capacitor layers.

Furthermore, in order to accomplish the aforementioned objects of the present invention, there is provided a method for fabricating a multilayer chip, the method comprising the steps of: manufacturing resistor layers by forming resistive material on the surface of green sheets; manufacturing capacitor layers; stacking and compressing the resistor layers and capacitor layers; thermally plasticizing the compressed stacked structure; and forming external electrodes at both ends of the stacked structure for electrical connection with the resistor and capacitor layers.

BRIEF DESCRIPTION OF THE DRAWINGS

For fuller understanding of the nature and object of the invention, reference should be made to the following detailed description taken in conjunction with the accompanying drawings in which.

DETAILED DESCRIPTION OF THE INVENTION

Object and characteristics of the present invention will become apparent from the following detailed description of preferred embodiments with reference to the accompanying drawings.

A stacked type capacitor chip and a method for making the same will be described with reference to FIG. 4 in accordance with a first embodiment of the present invention.

First of all, there should be provided raw material of powder for making a capacitor element that is being sold on the market for industrial uses. A PVB-based binder of about 8% in weight of the powder is dissolved in a toluene/alcohol-based solvent and put together with the powder. The mixture is milled by a small ball mill for about 24 hours and blended to make slurry, which is made into green sheets in a desired thickness (for instance, thickness of 30~50μm) in a method like doctor blade.

Accordingly, a hole-puncher is utilized to form through holes on the green sheets. At this time, the through holes are formed to connect every other green sheet in a stacked structure. Then, electrode paste of Ag, Pd, Ag—Pd, Ni or the like is screen printed on the green sheet to form a predetermined pattern of internal electrode.

Figure 1:
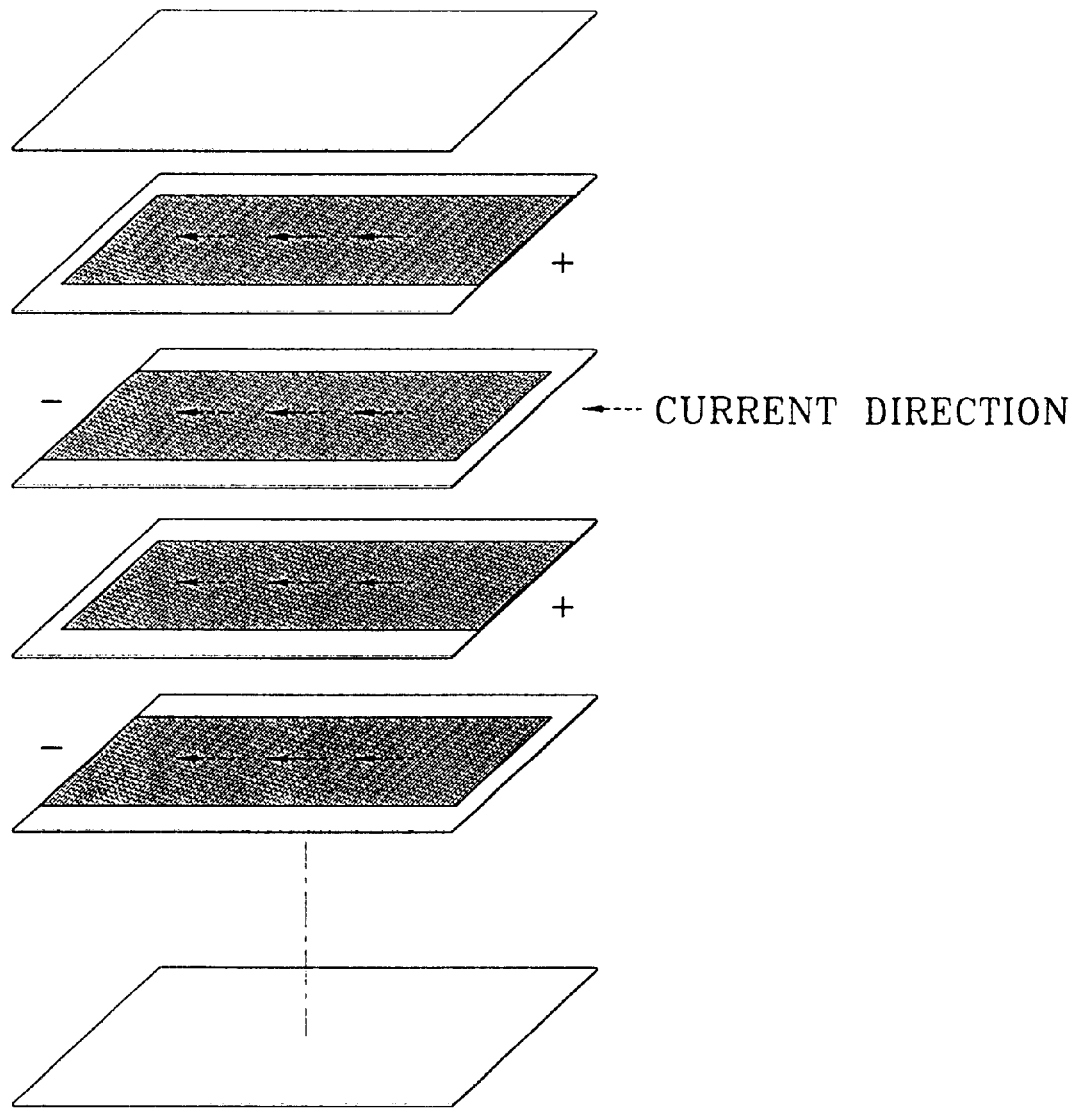
FIG. 1 is a schematic view for illustrating a structure of a stacked type capacitor chip in the prior art.
Figure 2:
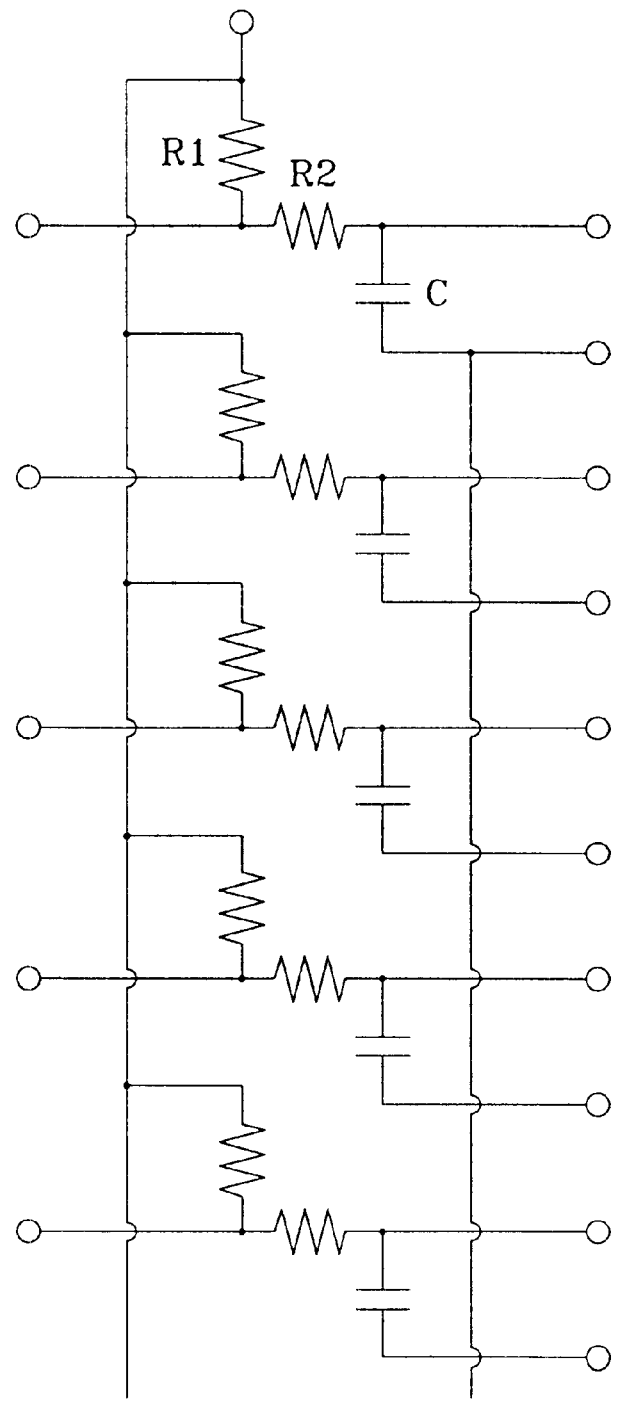
FIG. 2 is a circuit diagram for illustrating a RC coupled element in accordance with the prior art.
Figure 3:
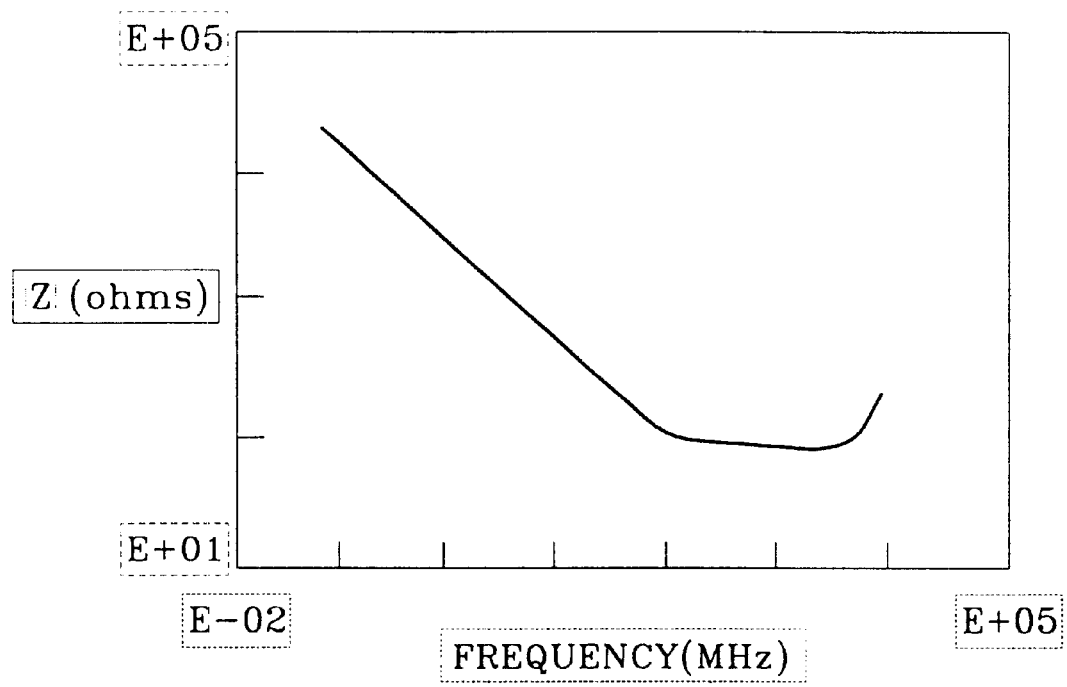
FIG. 3 is a curved line for illustrating an impedance characteristic relating to frequencies in the RC coupled element of the prior art.
Figure 4:
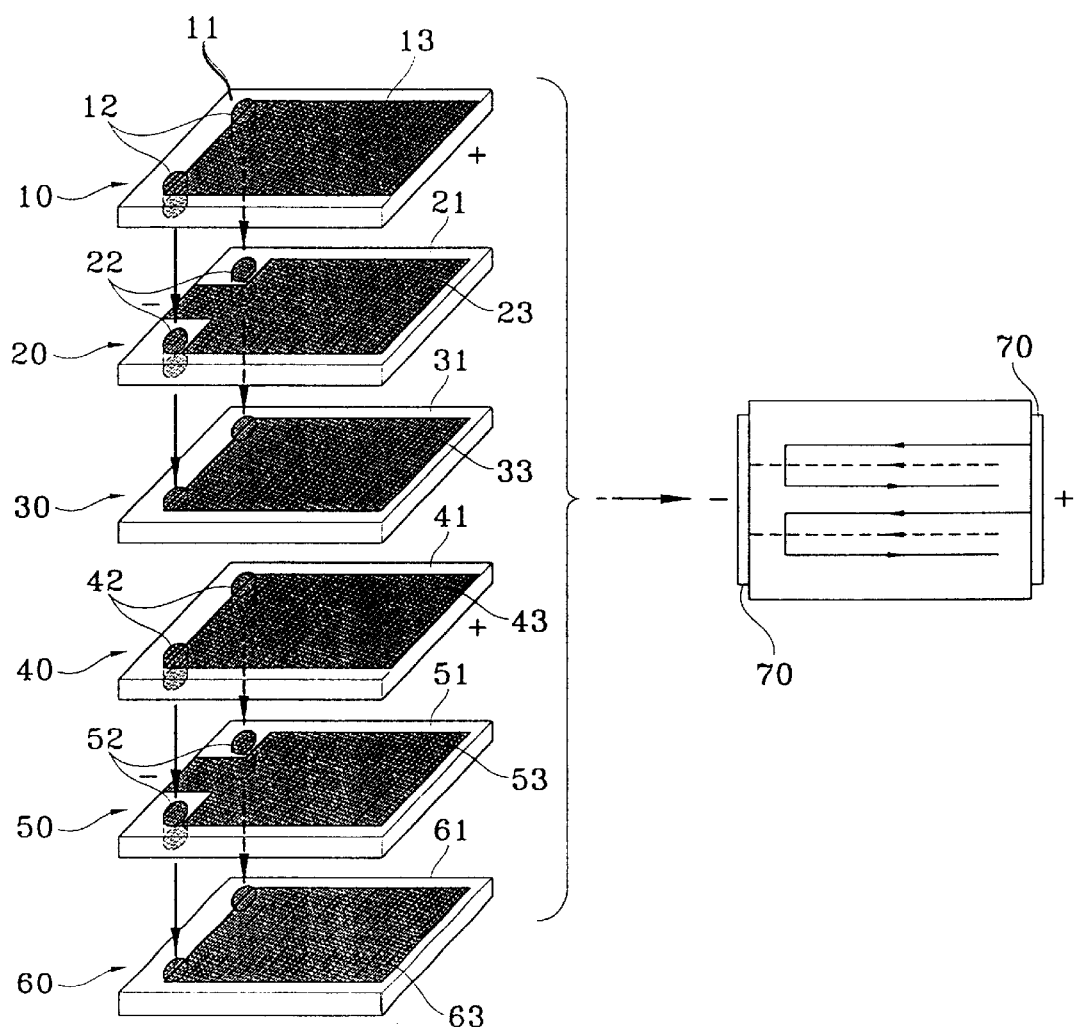
FIG. 4 illustrates a stacked type capacitor chip and a method for fabricating the same in accordance with a first embodiment of the present invention.

In other words, as shown FIG. 4, the through holes 12 are formed at predetermined positions of a green sheet 11. The electrode paste is printed on the surface of the green sheet 11 and into the through holes 12 at the same time to form an internal electrode 13 that get in an electrical connection with a positive external electrode and the electrode of the through holes 12, 22, but electrically insulates against negative external electrode. As a result, a first layer 10 is completely formed by the aforementioned steps.

Furthermore, after formation of the through holes 22 at the predetermined positions of the green sheet 21, electrode paste is printed on the surface of the green sheet 21 and in the through holes 22 at the same time to form an internal electrode 23 that gets in an electrical connection with the negative external electrode but electrically insulates against the positive external electrode and the electrode of the through holes 12, 22. As a result, a second layer 20 is completely formed by the aforementioned steps.

In addition, electrode paste is printed on the surface of the green sheet 31 to form an internal electrode 33 that electrically insulates against the positive and negative external electrodes but gets in an electrical connection with the electrode of the through holes 12, 22, so as to completely form a third layer 30.

Furthermore, fourth through sixth layers 40, 50, 60 are formed identically to the first through third layers 10, 20, 30.

After sequential stacked of the first through sixth layers 10~60, the stacked layers are compressed by heat of about 80~120 centigrade degrees and pressure. At this time, the internal electrodes 13, 33 of the first and third layers 10, 30 are electrically connected through the electrode of the through holes 12, 22, and the internal electrodes of the fourth and sixth layers 40, 60 are electrically connected through the electrode of the through holes.

Then, in order to thoroughly eliminate various components of the binder remaining in the stacked structure compressed as such, the compressed stacked structure is baked out by heating for about 6 hours at about 400 centigrade degrees and adequately plasticized at a higher temperature (for instance, 1100~1300 centigrade degrees). At last, external electrodes 70 are formed for connection with internal electrodes 13, 23 at the external side of the plasticized stacked structure.

If positive/negative voltages are applied to the external electrode 70 of the multilayer chip capacitor thus constructed, as shown with arrows in FIG. 4, partially, the current directions flowing in the internal electrodes of adjacent layers are reverse each other, so that inductance component is offset to make a reduction in the equivalent inductance component.

At this time, even though the aforementioned description has been made about a multilayer chip capacitor where the first through sixth layers have been sequentially stacked in FIG. 4, the description is not limited thereto, but a mono-capacitor chip can also be fabricated by stacking the first through third layers 10, 20, 30, and, also, by stacking a plurality of stacked structures, each consisting of the first through third layers 10, 20, 30.

A stacked type capacitor chip and a method for fabricating the same will be described in accordance with a second preferred embodiment of the present invention.

According to the stacked type capacitor chip and the method for fabricating the same in the second embodiment of the present invention, through holes connecting only not-neighboring layers and connecting only neighboring layers have been respectively formed for electrical connection with internal electrodes of layers. The current directions flowing in the internal electrode in all the neighboring layers are opposite, so that the inductance of all layers has been offset, zeroing the total equivalent inductance component.

At first, green sheets are manufactured in the same method as those for fabricating a stacked type capacitor chip illustrated in accordance with the first embodiment of the present invention. Then, a hole-puncher is utilized to form through holes on the green sheets. At this time, the through holes are formed to respectively connect only not-neighboring green sheets or only neighboring green sheets. Then, the electrode paste of Ag, Pd, Ag—Pd, Ni or the like is screen-printed on the green sheets to form a predetermined pattern of internal electrodes.

Figure 5:
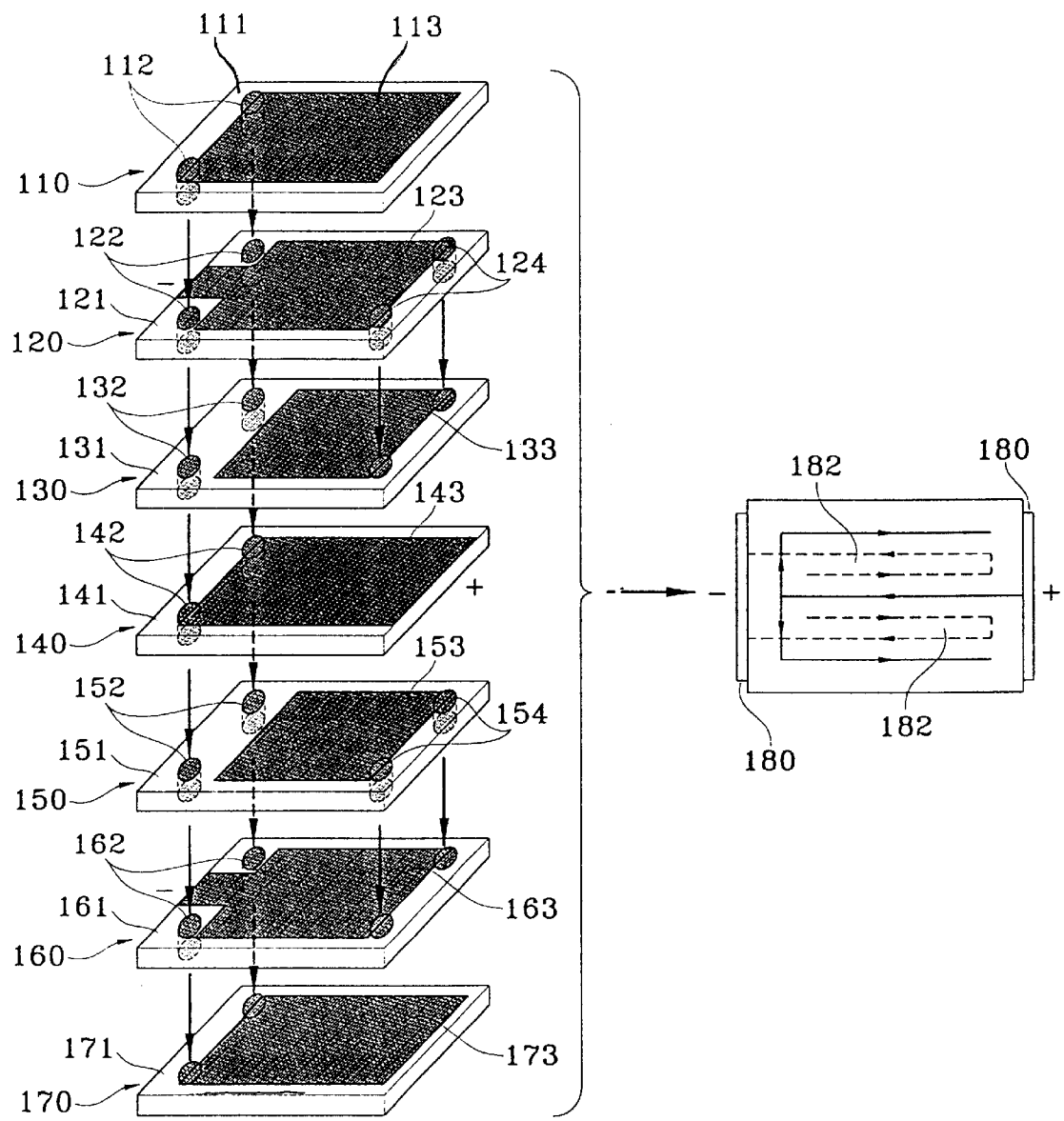
FIG. 5 illustrates a stacked type capacitor chip and a method for fabricating the same in accordance with a second embodiment of the present invention.

In other words, as described in FIG. 5, after formation of through holes 112 at predetermined positions of the green sheets 111, the electrode paste is printed on the surface of the green sheet 111 and in the through holes 112 at the same time to form internal electrode 113 that electrically insulates against positive and negative external electrodes, but electrically connects the electrode of the through holes 112, 122, 132, 142, 152, 162. As a result, a first layer 110 is completely formed by the aforementioned steps.

Furthermore, after formation of the through holes 122, 124 at the predetermined positions of the green sheet 121, electrode paste is printed on the surface of the green sheet 121 and in the through holes 122, 124 at the same time to form an internal electrode 123 that gets in an electrical connection with negative external electrode and the electrode of the through holes 124 but electrically insulates against the positive external electrode and the electrode of the through holes 112, 122, 132, 142, 152, 162. As a result, a second layer 120 is completely formed by the aforementioned steps.

In addition, after formation of the through holes 132 at the predetermined positions of the green sheet 131, electrode paste is printed on the surface of the green sheet 131 and in the through holes 132 at the same time to form an internal electrode 133 that electrically insulates against the positive and negative external electrodes and the electrode of the through holes 112, 122, 132, 142, 152, 162 but gets in an electrical connection with the electrode of the through holes 124, thereby completely forming a third layer 130.

Furthermore, after formation of the through holes 142 at the predetermined positions of the green sheet 141, electrode paste is printed on the surface of the green sheet 141 and in the through holes 142 at the same time to form an internal electrode 143 that electrically connects a positive external electrode and the electrode of the through holes 112, 122, 132, 142, 152, 162, but insulates against the negative external electrode, thereby completely forming a fourth layer 140.

Besides, after formation of the through holes 152, 154 at the predetermined positions of the green sheet 151, electrode paste is printed on the surface of the green sheet 151 and in the through holes 152, 154 at the same time to form an internal electrode 153 that electrically insulates positive and negative external electrodes and the electrode of the through holes 112, 122, 132, 142, 152, 162, but gets in an electrical connection with the electrode of the through holes 154, thereby completely forming a fifth layer 150.

Furthermore, after formation of through holes 162 at the predetermined positions of the green sheet 161, electrode paste is printed on the surface of the green sheet 161 and in the through holes 162 at the same time to form an internal electrode 163 that electrically insulates a positive external electrode and the electrode of the through holes 112, 122, 132, 142, 152, 162, but gets in an electrical connection with a negative external electrode and the electrode of the through holes 154, thereby completely forming a sixth layer 160.

Then, electrode paste is printed on the surface of the green sheet 171 to form an internal electrode 173 that electrically insulates positive and negative external electrodes but gets in an electrical connection with the electrode of the through holes 112, 122, 132, 142, 152, 162, thereby completely forming a seventh layer 170.

Next, the first through seventh layers 110~170 are sequentially stacked and tightly compressed by heat of about 80~120 centigrade degrees and pressure. At this time, internal electrodes 113, 143, 173 of the first, fourth, seventh layers 110, 140, 170 are electrically connected through the electrode of the through holes 112, 122, 132, 142, 152, 162. The internal electrodes 123, 133 of the second and third layers 120, 130 are electrically connected through the electrode of the through holes 124. The internal electrodes 153, 163 of the fifth and sixth layers 150, 160 are electrically connected through the electrode of the through holes 154.

In order to thoroughly eliminate a variety of binder components in the compressed stacked structure, the stacked structure thus constructed will be backed out by heating at about 400 centigrade degrees for 6 hours and then plasticized at an increased, higher plasticization temperature (for instance, 1100~1300 centigrade degrees). At the external parts of the plasticized stacked structure, external electrodes 180 are formed for electrical connection with internal electrodes 123, 143, 163 of the stacked structure.

If positive/negative voltages are applied to external electrodes 180 of the multilayer chip capacitor thus constructed, as shown in FIG. 5, the current directions flowing in the internal electrodes of almost all the layers are reverse to offset inductance, thereby almost zeroing the equivalent inductance even at high frequency. Also, equivalent series resistance decreases as an absolute resistance value of the internal electrodes is low or the area of the internal electrodes gets larger. As the number of dummy layers 182 that does not contribute to the capacity increases, the area of the internal electrodes against the capacity increases to lower down the equivalent series resistance value, thereby reducing unnecessary electricity consumption.

In FIG. 5, a description has been made on the stacked type capacitor chip, in which the first through seventh layers 110~170 are stacked in sequence, as the preferred embodiment of the present invention. However, the present invention is not limited thereto, but a mono-capacitor can also be fabricated by stacking a plurality of the stacked structures constructed with the first through seventh layers 110~170.

Besides, a variety of stacked type capacitor chips can be fabricated on the basis of the aforementioned basic structures of the stacked capacitor chips in accordance with the first and second embodiments of the present invention.

Figure 6A:
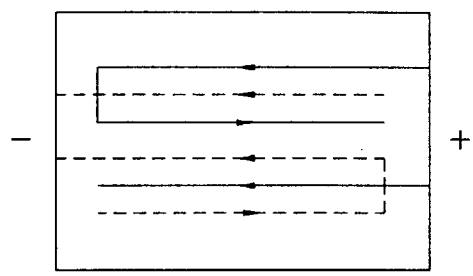
FIGS. 6a through 6c are schematic views for illustrating a stacked type capacitor chip in accordance with third through fifth embodiment of the present invention.
Figure 6B:
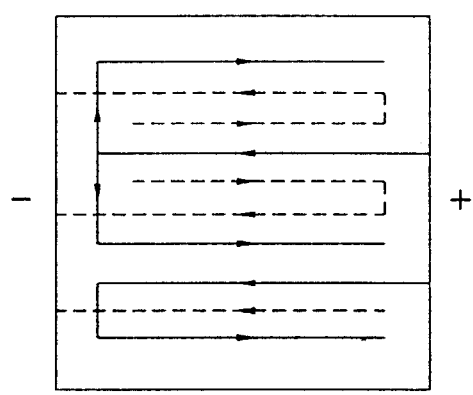
Figure 6C:
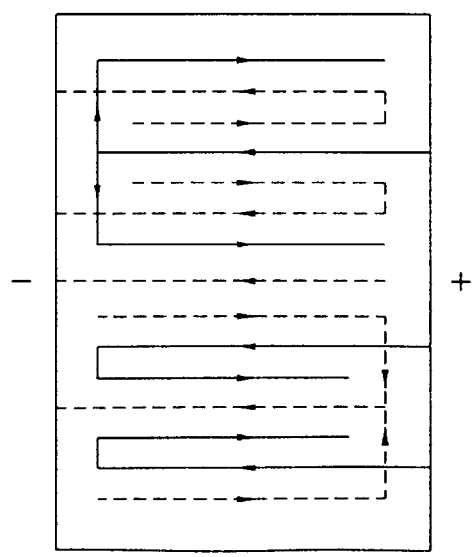

For instance, as shown in FIG. 6a, through holes are formed at every other side of a stacked type capacitor chip, which prevents concentration of the through holes at one side of the multilayer chip. As a result, dissymmetry of the multilayer chip may be relieved in plasticization. As shown in FIG. 6b, the patterns of stacked type capacitor chip designed in accordance with the first and second embodiments of the present invention can be used in combination to manufacture capacitors having various dimensions of capacity. As shown in FIG. 6c, a design pattern of a stacked type capacitor chip illustrated in accordance with the second embodiment of the present invention and another pattern of a stacked type capacitor chip shown in FIG. 6a are applied to increase the capacity of a capacitor and to relieve dissymmetry in plasticization.

On the other hand, the aforementioned method for fabricating a multilayer chip, where the current directions flowing in the internal electrode of neighboring layers are opposite, can also be applied to produce varistor, NTC thermistor and other electronic parts. For instance, in case of varistor, an additive like $Bi_2O_2$, CoO, MnO or the like is put into raw powder for a varistor like ZnO, which is on the market for industrial uses and, then, ball-milled for 24 hours with water or alcohol as a solvent. The resultant raw powder is made into green sheets. The same method for fabricating the aforementioned stacked type capacitor chip is applied onto the green sheets, so as to produce a varistor that reduces inductance at high frequency.

Besides, more than two mono-multilayer chips fabricated in the above methods can be combined for desired characteristics to produce a multi-type multilayer chip. For instance, the capacitor and varistor constructed in the aforementioned methods are attached to manufacture a composite element.

As described above, the stacked type capacitor chip of the present invention improves an internal pattern of a multilayer chip to make the current directions flowing in the neighboring layers opposite, which offsets inductance, so that the stacked type capacitor chip has a stable operation characteristic even at high frequency and reduces the equivalent series resistance value by controlling the area of internal electrodes for less electricity consumption.

A stacked type RC series coupled chip and a method for fabricating the same of the present invention will be described with reference to FIGS. 7 and 8.

First of all, green sheets are manufactured in the same method as those for fabricating the stacked type capacitor chip shown in the first embodiment of the present invention. Then, a hole-puncher is used to form through holes in the green sheets. At this time, the through holes are made to connect every other green sheets, that is, not-neighboring green sheets when a plurality of green sheets are stacked. Then, resistive paste like $RuO_2$ paste is printed to form resistance in the through holes. At this time, the through holes can be made in a variety of types such as multi-angular shape or cylindrical shape. The resistance value is adjusted by shape, size and number of through holes. Then, the electrode paste of Ag, Pd, Ag—Pd, Ni or the like is screen-printed on the green sheets to form a predetermined pattern of internal electrode.

Figure 7:
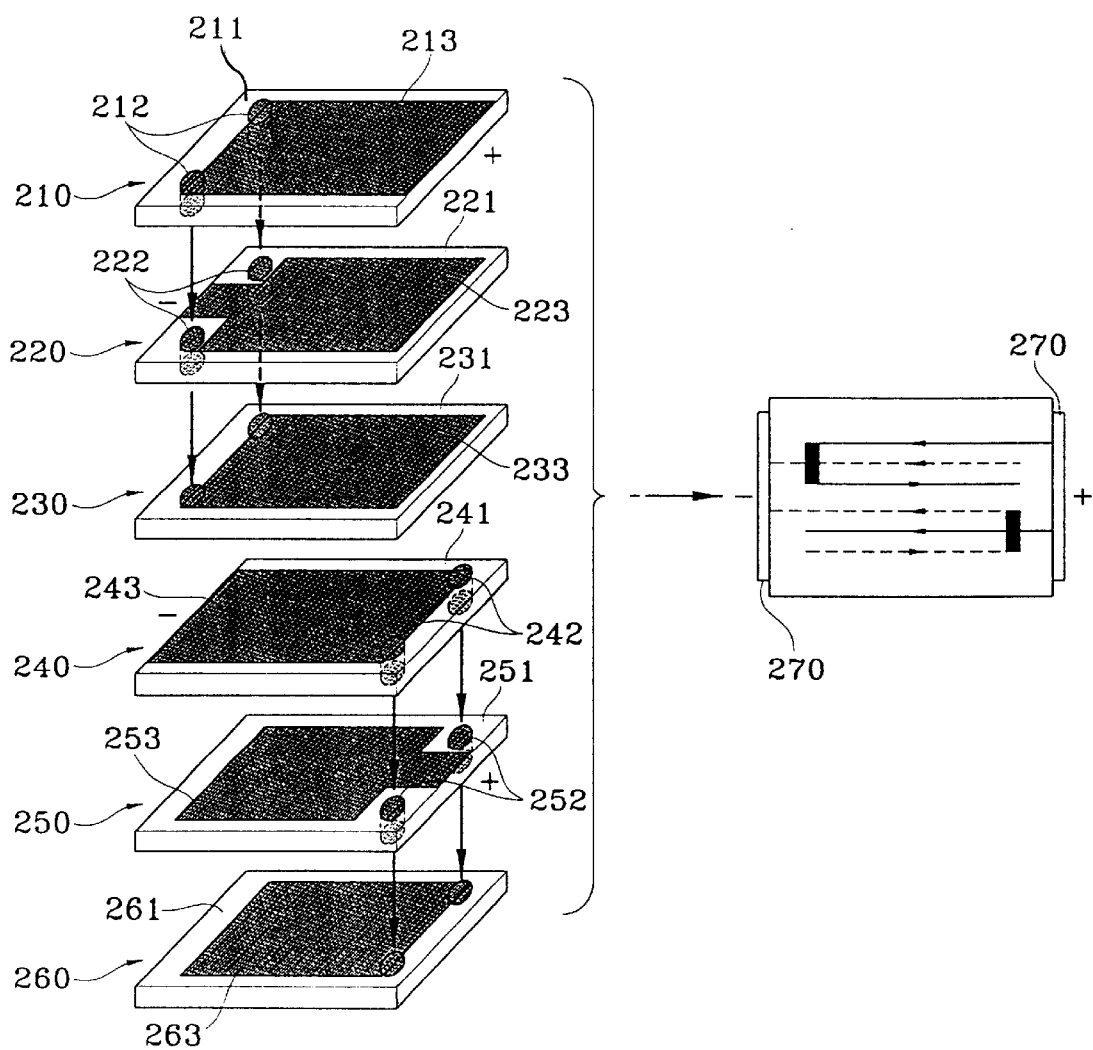
FIG. 7 illustrates a stacked type RC series coupled chip and a method for fabricating the same in accordance with the present invention.

As shown in FIG. 7, through holes 212 are formed at the predetermined positions of a green sheet 211 and filled with resistive material. Then, electrode paste is printed on the surface of the green sheet 211 to form an internal electrode 213 that electrically connects a positive external electrode and the resistive material of the through holes, but electrically insulates against a negative external electrode, thereby completely forming a first layer 210.

Furthermore, after through holes 222 are formed at the predetermined positions of the green sheet 221 and filled with resistive material, electrode paste is printed on the surface of the green sheet 221 to form an internal electrode 223 that gets in an electrical connection with a negative external electrode but electrically insulates against the positive external electrode and the resistive material of the through holes 212, 222, thereby completely forming a second layer 220.

In addition, electrode paste is printed on the surface of the green sheet 231 to form an internal electrode 233 that electrically insulates against the positive and negative external electrodes but gets in an electrical connection with the resistive material of the through holes 212, 222, thereby completely forming a third layer 230.

Furthermore, after through holes 242 are formed at the predetermined positions of the green sheet 241 and filled with resistive material, electrode paste is printed on the surface of the green sheet 241 to form an internal electrode 243 that electrically connects the negative external electrode and the resistive material of the through holes 242, 252, but electrically insulates against the positive external electrode, thereby completely forming a fourth layer 140.

Besides, after through holes 252 are formed at the predetermined positions of the green sheet 251 and filled with resistive material, electrode paste is printed on the surface of the green sheet 251 to form an internal electrode 253 that gets in an electrical connection with the positive external electrode, but electrically insulates negative external electrode and the resistive material of the through holes 242, 252, thereby completely forming a fifth layer 250.

In addition, electrode paste is printed on the surface of the green sheet 261 to form an internal electrode 263 that electrically insulates against the positive and negative external electrodes but gets in an electrical connection with the resistive material of the through holes 242, 252, thereby completely forming a sixth layer 260.

Next, the first through sixth layers 210~260 are sequentially stacked and tightly compressed by heat of about 80~120 centigrade degrees and pressure. At this time, internal electrodes 213, 233 of the first and third layers 210, 230 are electrically connected through the resistive material of the through holes 212, 222. Also, the internal electrodes 243, 263 of the fourth and sixth layers 240, 260 are electrically connected through the resistive material of the through holes 242, 252.

In order to thoroughly eliminate a variety of binder components in the compressed stacked structure, the stacked structure thus constructed will be backed out by heating at about 400 centigrade degrees for 6 hours and then plasticized at an increased, higher plasticization temperature (for instance, 1100~1300 centigrade degrees). At the external parts of the plasticized stacked structure, external electrodes 270 are formed for electrical connection with the internal electrodes of the stacked structure.

Figure 8:
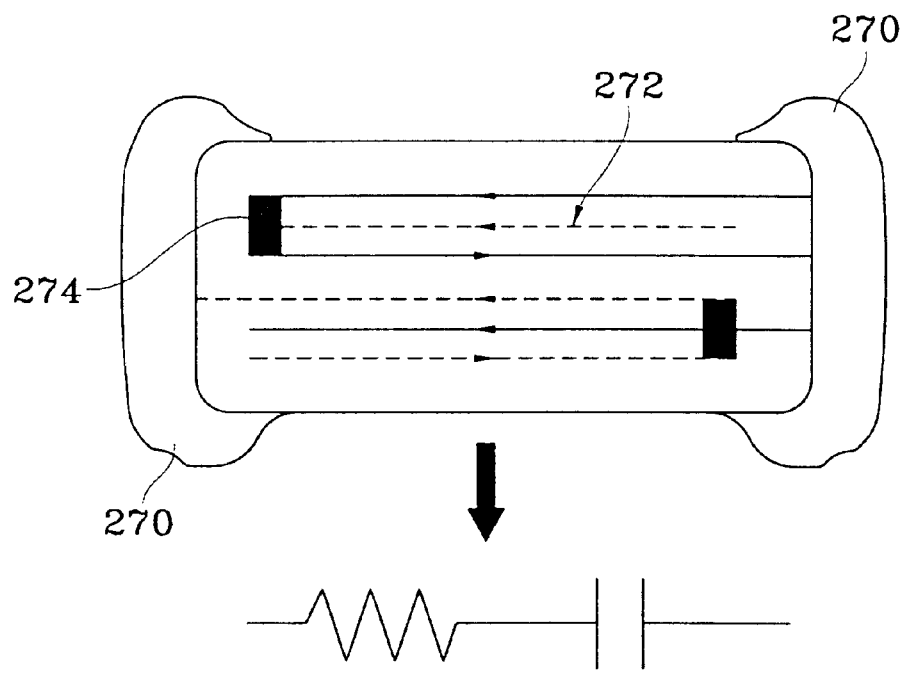
FIG. 8 is a schematic, cross-sectional view of a stacked type RC series coupled chip and its equivalent circuit in accordance with the present invention.

As a result, the stacked type RC coupled chip thus constructed, as shown in FIG. 8, includes a capacitor component 272 and a resistor component 274 of the through holes. The equivalent circuit becomes a shape of a RC series coupled element in which the capacitor and resistor components 272, 274 are connected in series.

If positive/negative voltages are applied to external electrodes 270 of the stacked type RC series coupled chip thus constructed, as shown in FIG. 8, the current directions flowing in the internal electrodes of neighboring layers are reverse to offset inductance component and to significantly reduce the equivalent inductance component at high frequency.

Figure 9:
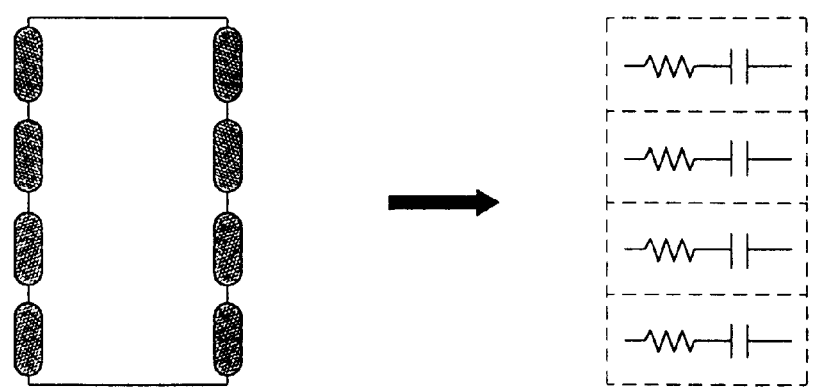
FIG. 9 is a schematic, external view of a RC series coupled array chip and its equivalent circuit in accordance with the present invention.

Also, the pattern of the internal electrode of the stacked type RC series coupled chip and the through holes forming pattern can be designed to repeat several times and the aforementioned fabricating method can be utilized to produce a RC series coupled array chip in which a plurality of RC series coupled elements are stacked as shown in FIG. 9.

A stacked type RC parallel coupled chip and a method for fabricating the same will be described with reference to FIGS. 10 and 11 in accordance with a first embodiment of the present invention.

First of all, green sheets are manufactured in the same method as those for fabricating the stacked type RC series coupled chip. Then, a hole-puncher is used to form through holes in the green sheets to connect the neighboring green sheets in stacked. Then, resistive paste like $RuO_2$ paste is printed into the through holes to form resistance. Then, electrode paste of Ag, Pd, Ag—Pd, Ni or the like is screen-printed on the green sheets to form internal electrode, thereby forming resistor layers 300. At this time, the through holes can be made in a variety of types such as multi-angular shape or cylindrical shape. The resistance value is adjusted by shape, size and number of through holes.

Figure 10:
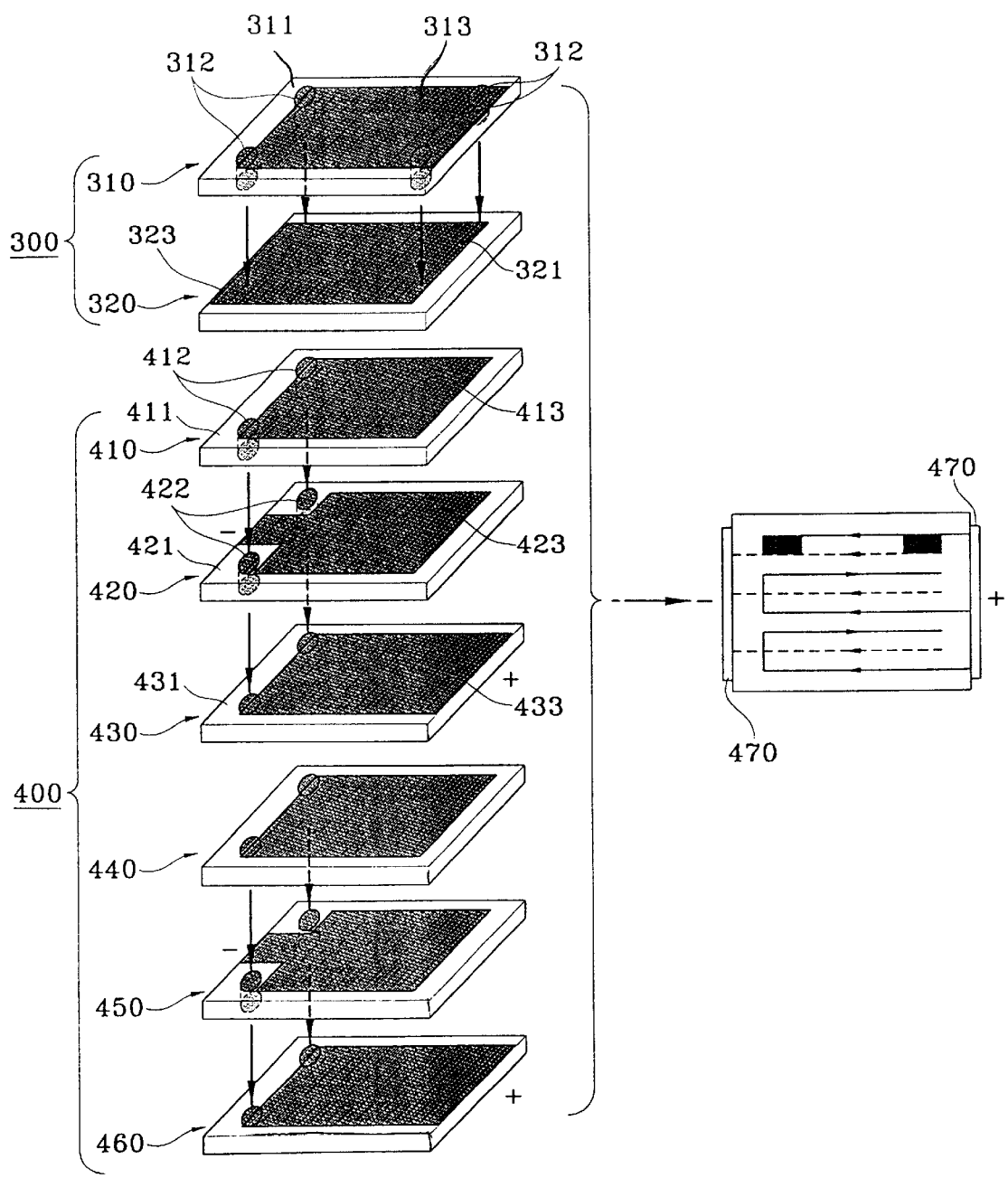
FIG. 10 illustrates a stacked type RC parallel coupled chip and a method for fabricating the same in accordance with a first embodiment of the present invention.

As shown in FIG. 10, through holes 312 are formed at the predetermined positions of a green sheet 311 and filled with resistive material. Then, electrode paste is printed on the surface of the green sheet 311 to form an internal electrode 313 that electrically connects a positive external electrode and the resistive material of the through holes 312, but electrically insulates against a negative external electrode, thereby completely forming a first resistor layer 310.

Furthermore, electrode paste is printed on the surface of the green sheet 321 to form an internal electrode 323 that gets in an electrical connection with a negative external electrode and the resistive material of the through holes 312, but electrically insulates against the positive external electrode, thereby completely forming a second resistor layer 320.

Next, through holes are formed to connect the not-neighboring green sheets in stacked. Electrode paste of Ag, Pd, Ag—Pd, Ni or the like is screen-printed on the surface of the green sheets and into the through holes to form internal electrode, thereby forming capacitor layers 400.

In other words, as shown in FIG. 10, after formation of the through holes 412 at the predetermined positions of the green sheet 411, electrode paste is printed on the surface of the green sheet 411 and into the through holes 412 to form an internal electrode 413 that electrically connects an electrode of the through holes 412, 422 but electrically insulates against positive and negative external electrodes, thereby completely forming a first capacitor layer 410.

In addition, after formation of through holes 422 at the predetermined positions of the green sheet 421, electrode paste is printed on the surface of the green sheet 421 and the into the through holes 422 to form an internal electrode 423 that gets in an electrical connection with the negative external electrode, but electrically insulates against the positive external electrode and the electrode of the through holes 412, 422, thereby completely forming a second capacitor layer 420.

Besides, electrode paste is printed on the surface of the green sheet 431 to form an internal electrode 433 that electrically insulates against the negative external electrode, but gets in an electrical connection with the positive external electrode and the electrode of the through holes 412, 422, thereby completely forming a third capacitor layer 430.

Furthermore, fourth through sixth capacitor layers 440, 450, 460, as shown in FIG. 10 are manufactured in the same method as the first through third capacitor layers 410, 420, 430.

Next, the first and second resistor layers 310, 320 and the first through sixth layers 410~460 are sequentially stacked and tightly compressed by heat of about 80~120 centigrade degrees and pressure. At this time, internal electrodes 313, 323 of the first and second resistor layers 310, 320 are electrically connected through the resistive material of the through holes 312. Also, the internal electrodes 413, 433 of the first and third capacitor layers 410, 430 are electrically connected through the electrode of the through holes 412, 422. The internal electrode of the fourth and sixth capacitor layers 440, 460 are electrically connected through the electrode of the through holes.

In order to thoroughly eliminate a variety of binder components in the compressed stacked structure, the stacked structure thus constructed will be backed out by heating at about 400 centigrade degrees for 6 hours and then plasticized at an increased, higher plasticization temperature (for instance, 1100~1300 centigrade degrees). At the external parts of the plasticized stacked structure, external electrodes 470 are formed for electrical connection with the internal electrodes of the stacked structure.

Figure 11:
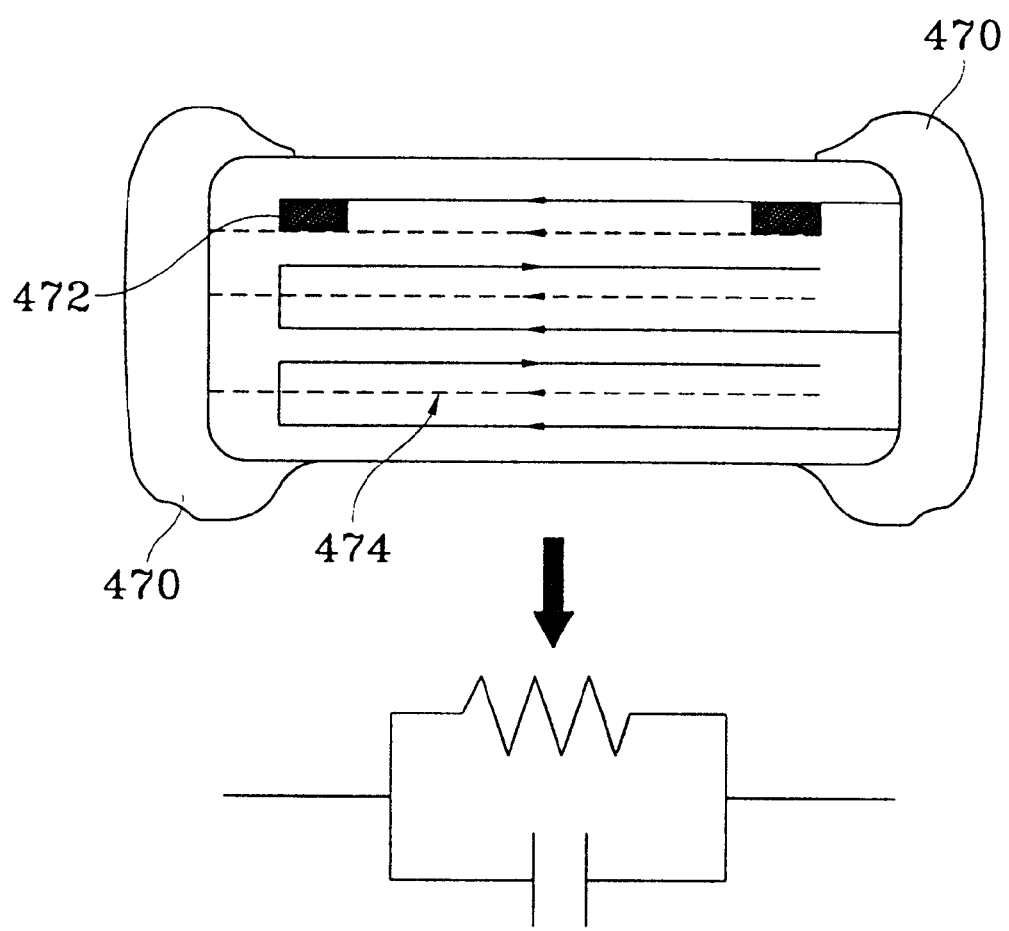
FIG. 11 is a schematic, cross-sectional view of a stacked type RC parallel coupled chip and its equivalent circuit in accordance with the first embodiment of the present invention.

As a result, the stacked type RC coupled chip thus constructed, as shown in FIG. 11, includes a resistor component 472 and a capacitor component 474 of through holes. The equivalent circuit becomes a shape of a RC parallel coupled element in which the resistor and capacitor components 472, 474 are connected in parallel.

If positive/negative voltages are applied to external electrodes 470 of the stacked type RC parallel coupled chip thus constructed, as shown with arrows in FIG. 11, the current directions flowing in the internal electrodes of neighboring layers are reverse to offset inductance component and to significantly reduce the equivalent inductance component at high frequency.

A stacked type RC parallel coupled chip and a method for fabricating the same will be described with reference to FIGS. 12 and 13 in accordance with a second embodiment of the present invention.

First of all, green sheets are manufactured in the same method as those for fabricating the stacked type RC series coupled chip in accordance with the first embodiment of the present invention. Then, resistive paste like $RuO_2$ paste is printed on the surface of the green sheets.

Figure 12:
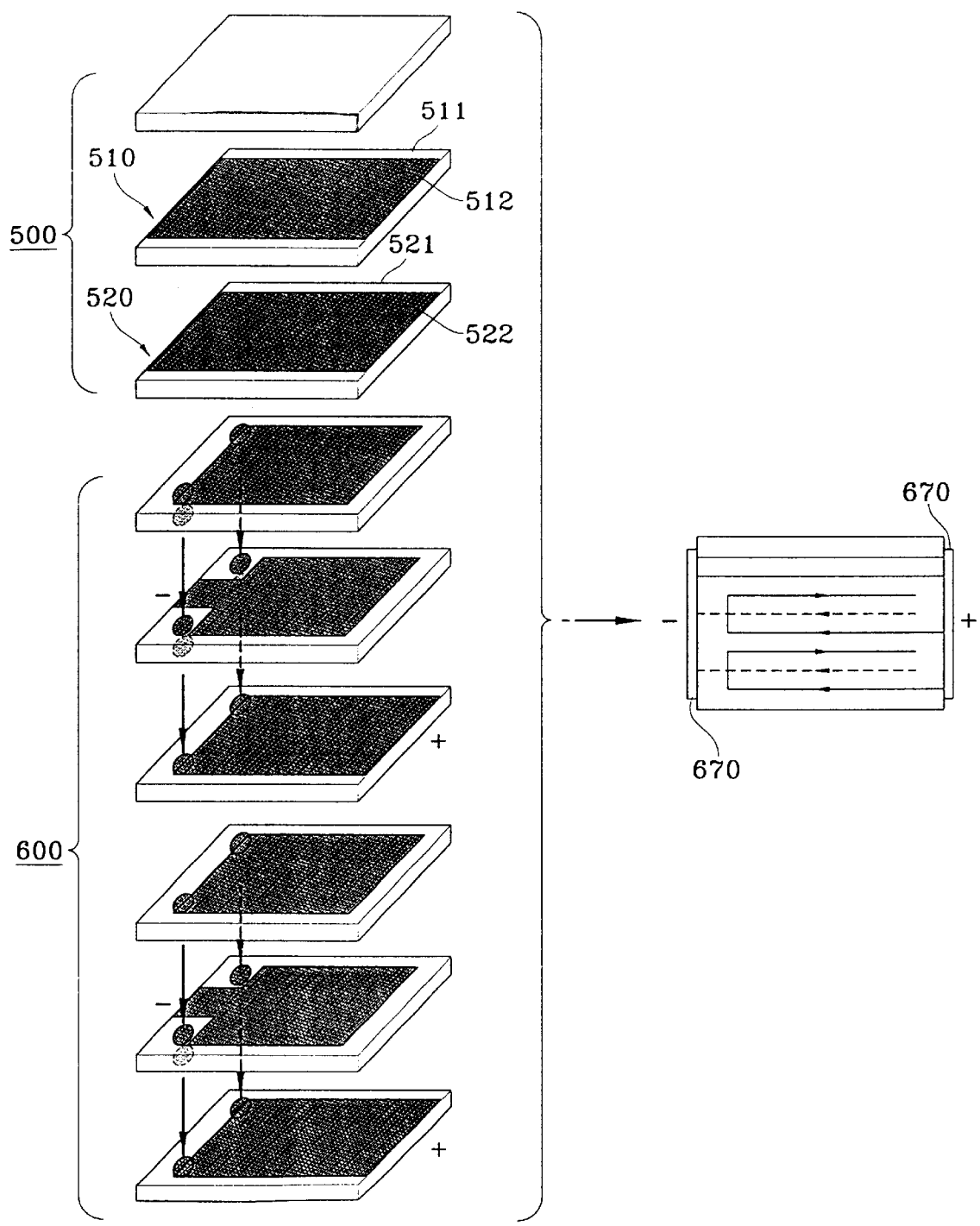
FIG. 12 illustrates a stacked type RC parallel coupled chip and a method for fabricating the same in accordance with a second embodiment of the present invention.

As shown in FIG. 12, electrode paste is printed on the surface of the green sheet 511 to electrically connect both ends of positive and negative external electrodes, thereby forming a first resistor layer 510. A second resistor layer is formed in the same method. At this time, the resistance value is adjusted by the resistor value of the resistive paste, area and thickness of the printed resistive paste and the number of stacked resistor layers.

Then, capacitor layers 600 are formed in the same method as those for fabricating the capacitor layers of the stacked type RC parallel coupled chip in accordance with the first embodiment of the present invention.

Next, the resistor layers 500 and capacitor layers 600 manufactured in the aforementioned method are sequentially stacked and tightly compressed by heat of about 80~120 centigrade degrees and pressure.

In order to thoroughly eliminate a variety of binder components in the compressed stacked structure, the stacked structure thus constructed will be backed out by heating at about 400 centigrade degrees for 6 hours and, then, plasticized at an increased, higher plasticization temperature (for instance, 1100~1300 centigrade degrees). At the external parts of the plasticized stacked structure, external electrodes 670 are formed for an electrical connection with the internal electrodes of the stacked structure.

Figure 13:
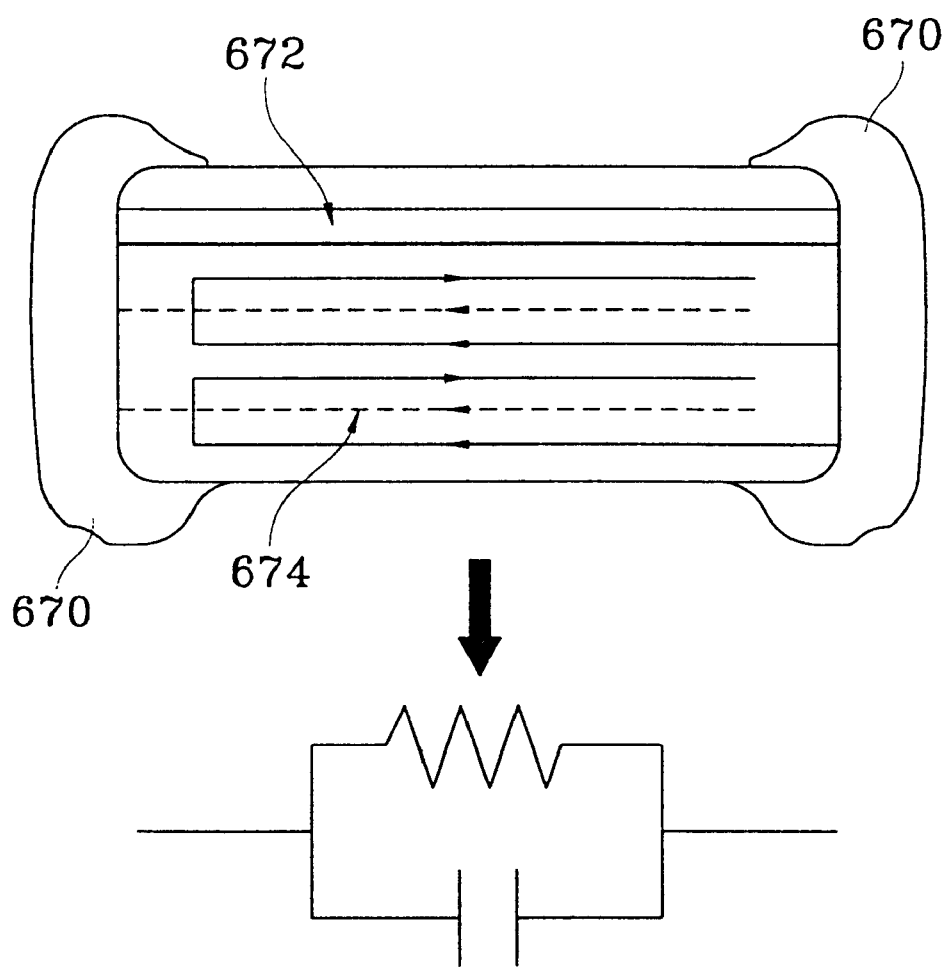
FIG. 13 is a schematic, cross-sectional view of a stacked type RC parallel coupled chip and its equivalent circuit in accordance with the second embodiment of the present invention.

As a result, the RC multilayer chip thus constructed, as shown in FIG. 13, includes a laterally printed resistor component 672 and a capacitor component 674. The equivalent circuit becomes a shape of a RC parallel coupled element in which the resistor and capacitor components 672, 674 are connected in parallel.

If positive/negative voltages are applied to external electrodes 670 of the stacked type RC parallel coupled chip thus constructed, as shown with arrows in FIG. 13, the current directions flowing in the internal electrodes of neighboring layers are reverse to offset inductance component and to significantly reduce the equivalent inductance component at high frequency. In addition, the resistance value can be easily adjusted by controlling the area of the resistor patterns and the number of stacked resistor layers.

Figure 14:
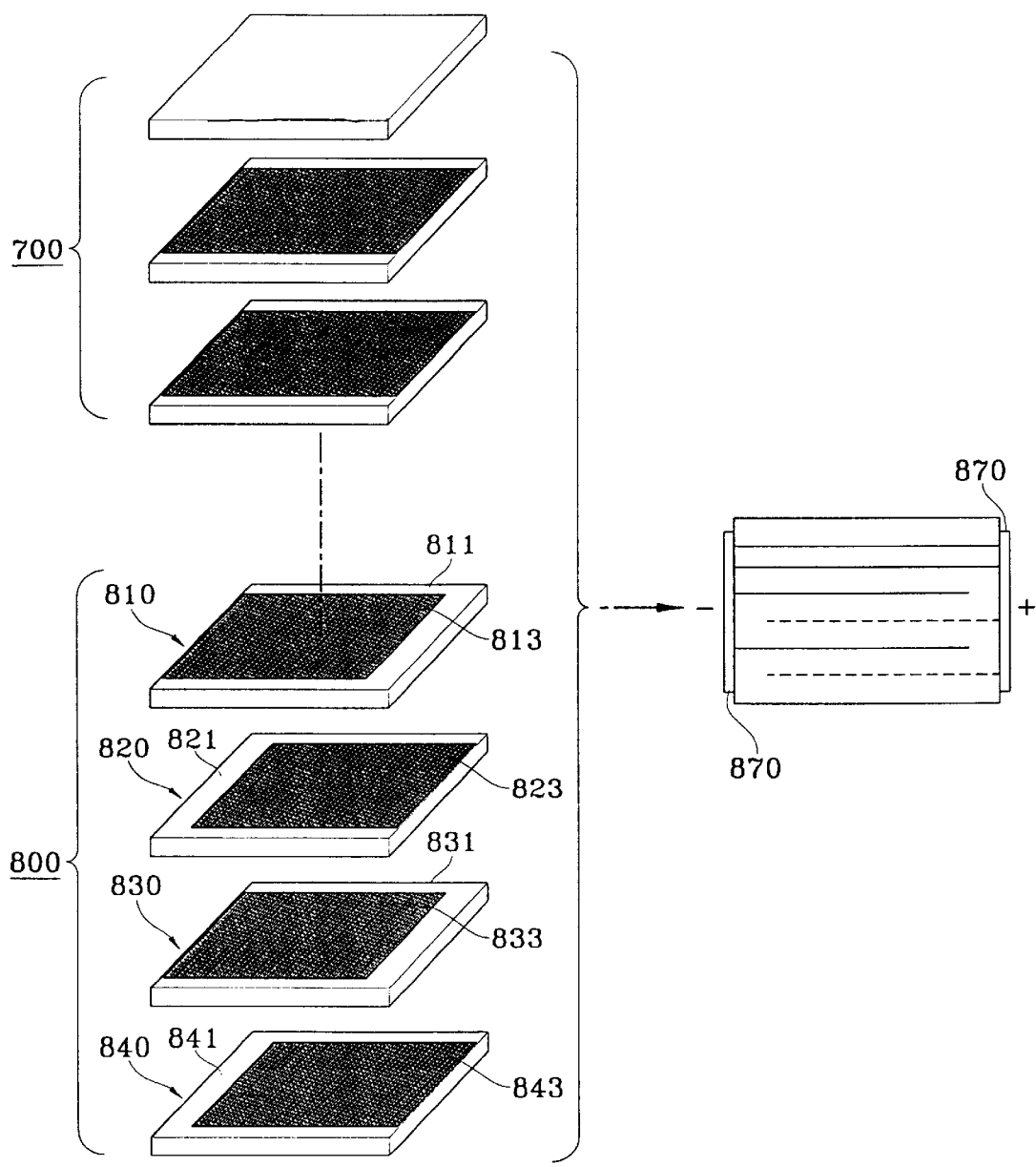
FIG. 14 illustrates a stacked type RC parallel coupled chip and a method for fabricating the same in accordance with a third embodiment of the present invention.

A stacked type RC parallel coupled chip and a method for fabricating the same will be described with reference to FIGS. 14 and 15 in accordance with a third embodiment of the present invention.

First of all, green sheets are manufactured in the same method as those for fabricating a stacked type RC series coupled chip of the present invention. Resistor layers 700 are formed in the same method as those for fabricating the stacked type RC parallel coupled chip in accordance with the second embodiment of the present invention. Electrode paste of Ag, Pd, Ag—Pd, Ni or the like is screen-printed on the surface of the green sheets, thereby stacking capacitor layers 800.

At this time, electrode paste is printed onto the green sheet 811 to form an internal electrode 813 that electrically connects a negative external electrode but electrically insulates against a positive external electrode, thereby forming a first capacitor layer 810. In addition, electrode paste is printed onto the green sheet 821 to form an internal electrode 823 that electrically connects a positive external electrode but electrically insulates against a negative external electrode, thereby forming a second capacitor layer 820. Furthermore, third and fourth capacitor layers 830, 840 are formed in the same method as the first and second capacitor layers 810, 820.

Next, the resistor layers 700 and capacitor layers 800 thus constructed are sequentially stacked and tightly compressed by heat of about 80~120 centigrade degrees and pressure.

In order to thoroughly eliminate a variety of binder components in the compressed stacked structure, the stacked structure thus constructed will be backed out by heating at about 400 centigrade degrees for 6 hours and then plasticized at an increased, higher plasticization temperature (for instance, 1100~1300 centigrade degrees). At the external parts of the plasticized stacked structure, external electrodes 870 are formed for electrical connection with the internal electrodes of the stacked structure.

Figure 15:
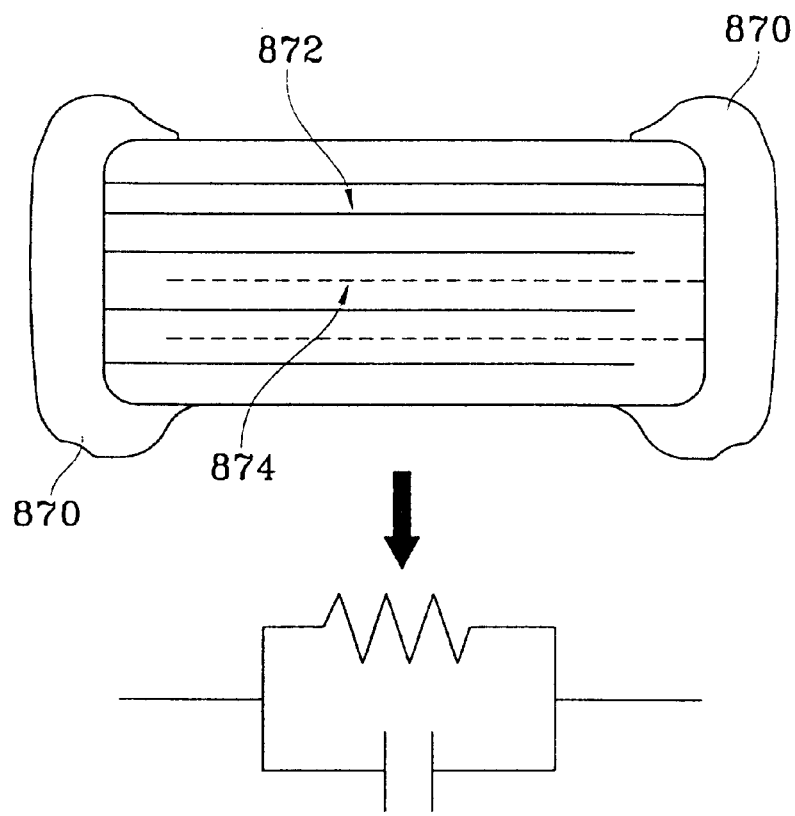
FIG. 15 is a schematic, cross-sectional view of a stacked type RC parallel coupled chip and its equivalent circuit in accordance with the third embodiment of the present invention.
Figure 16:
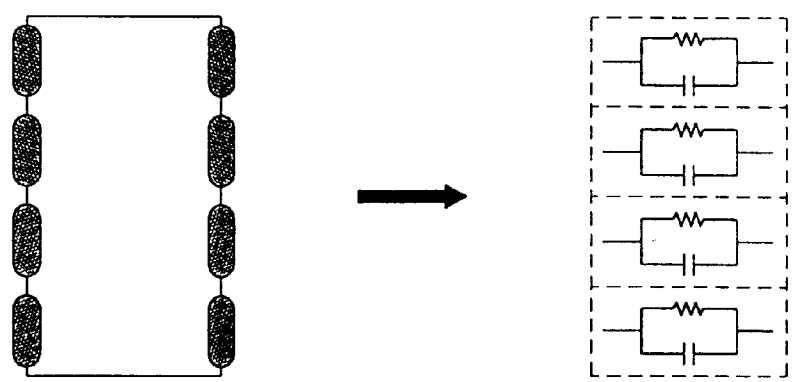
FIG. 16 illustrates an external view of a RC parallel coupled array chip and its equivalent circuit in accordance with the present invention.

As a result, the RC multilayer chip thus constructed, as shown in FIG. 15, includes a laterally printed resistor component 872 and a capacitor component 874. The equivalent circuit becomes a shape of a RC parallel coupled element in which the resistor and capacitor components 872, 874 are connected in parallel. Besides, the resistance value can be easily adjusted by controlling the area of the resistor component pattern and the number of stacked resistor layers, and a variety of capacitor values can be obtained by repeatedly stacking capacitor layers.

On the other hand, the internal pattern of the stacked type RC parallel coupled chip described in accordance with the first through third embodiments of the present invention can be repeated in design and the aforementioned fabricating method can be utilized, thereby making it possible to fabricate a RC parallel coupled array chip in which a plurality of RC parallel coupled elements can be stacked.

In addition, the methods for fabricating the stacked type RC series coupled chip and the stacked type RC parallel coupled chip are used in combination to fabricate an RC coupled chip in which there exist both series and parallel resistor components.

What is claimed is:

1. A low inductance multilayer chip, comprising:

a plurality of stacked layer with internal electrodes formed thereon; and an external positive electrode and an external negative electrode, each of said internal electrodes being electrically connected to only said external positive electrode or said external negative electrode;

wherein for at least some adjacent stacked layers, an end of said internal electrode on a first of said adjacent stacked layer is positive, and said end of said internal electrode on a second of said adjacent stacked layers is negative;

such that a direction of a current flow in said internal electrode of said first of said adjacent stacked layers is opposite to a direction, of a current flow in said internal electrode of said second of said adjacent stack layers.

2. The multilayer chip according to claim 1, wherein said stacked layers define through holes therein, with conductive material in said through holes, at least some of said internal electrodes of said stacked layers being electrically connected together by said conductive material in said through holes.

3. A low inductance multilayer chip, comprising:

a stacked structure comprising a plurality of green sheets stacked together, said green sheets defining at least two through holes therein;

internal electrodes formed on said greed sheets;

external positive and negative electrodes formed at both ends of said stacked structure, each of said internal electrodes being electrically connected to only said external positive electrode or said negative electrode; end conductive material in said through holes, at least some of said internal electrodes being electrically connected together by said conductive material in said through holes;

wherein for at least some adjacent green sheets, an end of said internal electrode on a first of said adjacent green sheets is positive, and said end of said internal electrode on a second of said adjacent green sheets is negative;

such that a direction of a current flow in said internal electrode of said first of said adjacent green sheets is opposite to a direction of a current flow in said internal electrode of said second of said adjacent green sheets.

4. The multilayer chip according to claim 3, wherein said through holes are defined at both ends of said stack structure in alternating green sheets.

5. A low inductance multilayer chip, comprising:

a plurality of stacked layers a with internal electrodes formed thereon; and an external positive electrode and an external negative electrode, each of said internal electrodes being electrically connected to only said external positive electrode or said external negative electrode; and at least some of said internal electrodes being electrically connected together by resistive material;

wherein for at least some adjacent stacked layers, an end of said internal electrode on a first of said adjacent stacked layer is positive, and said end of said internal electrode on a second of said adjacent stacked layers is negative;

such that a direction of a current flow in said internal electrode of said first of said adjacent stacked layers is opposite to a direction of a current flow in said internal electrode of said second of said adjacent stack layers.

6. The multilayer chip according to claim 5, wherein at least some of said stacked layers define through hale therein, said resistive material being in said through holes.

7. A low inductance multilayer chip, comprising;

a stacked structure comprising a plurality of green sheets stacked together said green sheets defining at least two through holes therein;

internal electrodes formed on said green sheets;

external positive and negative electrodes formed at both ends of said stacked structure, each of said internal electrodes being electrically connected to only said external positive electrode or said negative electrode; and resistive material in said through holes, at least some of said internal electrodes being electrically connected together by said resistive material in said through holes;

wherein for at least some adjacent green sheets, an end of said internal electrode on a first of said adjacent green sheets is positive, and said end of said internal electrode on a second of said adjacent green sheets is negative;

such that a direction of a current flow in said internal electrode of said first of said adjacent green sheets is opposite a direction of a current flow in said internal electrode of said second of said adjacent green sheets.

8. A low inductance multilayer chip comprising:

resistor layers;

capacitor layers, said capacitor layers comprising internal electrodes thereon; and an external positive electrode and an external negative electrode, each of said resistor layers being electrically connect to at least one of said external positive and negative electrodes, and each of said internal electrodes being electrically connected to only said external positive electrode or said external negative electrode;

wherein for at least some adjacent stacked layers, an end of said internal electrode on a first of said adjacent stacked layers is positive, and said end of said internal electrode on a second of said adjacent stacked layers is negative;

such that a direction of a current flow in said internal electrode of said first said adjacent stacked layers is opposite to a direction of a current flow in said internal electrode of said second of said adjacent stacked layers.

9. The multilayer chip according to claim 8, wherein external electrodes are formed at both ends of said stacked structure for electrical connection with said resistor layers and said internal electrode of said capacitor layers.

10. The multilayer chip according to claim 8, wherein said resistor layers comprise:

a plurality of green sheets stacked together, each of said green sheets defining at least two through holes therein;

internal electrodes formed on said green sheets; and resistive material in said through holes, said resistive material electrically connecting at least some of said internal electrodes of said resistor layers.

* * * * *